United States Patent
Yan et al.

(10) Patent No.: US 11,910,688 B2
(45) Date of Patent: Feb. 20, 2024

(54) ORGANIC LIGHT EMITTING DIODE DISPLAY SUBSTRATE HAVING BAND GAP LAYER, MANUFACTURING METHOD THEREOF, AND DISPLAY DEVICE

(71) Applicant: BOE TECHNOLOGY GROUP CO., LTD., Beijing (CN)

(72) Inventors: Guang Yan, Beijing (CN); Changyen Wu, Beijing (CN); Li Sun, Beijing (CN); Juanjuan You, Beijing (CN); Chengyuan Luo, Beijing (CN); Ling Wang, Beijing (CN); Dongfang Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 35 days.

(21) Appl. No.: 17/742,194

(22) Filed: May 11, 2022

(65) Prior Publication Data
US 2022/0278175 A1    Sep. 1, 2022

Related U.S. Application Data

(63) Continuation of application No. 16/766,155, filed as application No. PCT/CN2019/121553 on Nov. 28, 2019, now Pat. No. 11,362,149.

(30) Foreign Application Priority Data

Nov. 29, 2018  (CN) .......................... 201811443609.0

(51) Int. Cl.
*H10K 50/856*    (2023.01)
*H10K 59/38*    (2023.01)
(Continued)

(52) U.S. Cl.
CPC ........... *H10K 59/38* (2023.02); *H10K 50/856* (2023.02); *H10K 50/858* (2023.02); *H10K 71/00* (2023.02);
(Continued)

(58) Field of Classification Search
CPC .. H10K 50/844; H10K 50/856; H10K 50/858; H10K 59/12; H10K 59/1201; H10K 59/38; H10K 71/00
(Continued)

(56) References Cited

U.S. PATENT DOCUMENTS 11,362,149 B2 *   6/2022  Yan ..................... H10K 50/856
2012/0044443 A1   2/2012  Han et al.
(Continued)

FOREIGN PATENT DOCUMENTS

CN    103091756 A    5/2013
CN    103227189 A    7/2013
(Continued)

OTHER PUBLICATIONS

"First Office Action and English language translation", CN Application No. 201811443609.0, dated Mar. 23, 2020, 10 pp.
(Continued)

*Primary Examiner* — Hoai V Pham
(74) *Attorney, Agent, or Firm* — Myers Bigel, P.A.

(57) ABSTRACT

An organic light emitting diode display substrate includes a light emitting unit layer, a first band gap layer and a color conversion layer. The first band gap layer and the color conversion layer are on a light exit path of the light emitting unit layer. The light emitting unit layer includes first, second and third light emitting units periodically arranged on a driving substrate and emitting light of a first color. The color conversion layer converts a part of the light of the first color into light of a second color and a third color. The first band
(Continued)

gap layer is between the light emitting unit layer and the color conversion layer. The first band gap layer transmits the light of the first color in a light exit direction, and reflects the light of the second color and the light of the third color.

20 Claims, 7 Drawing Sheets

(51) Int. Cl.
*H10K 50/858* (2023.01)
*H10K 71/00* (2023.01)
*H10K 50/844* (2023.01)
*H10K 59/12* (2023.01)
*H10K 102/00* (2023.01)

(52) U.S. Cl.
CPC .......... *H10K 50/844* (2023.02); *H10K 59/12* (2023.02); *H10K 59/1201* (2023.02); *H10K 2102/3026* (2023.02)

(58) Field of Classification Search
USPC ........................................ 257/89; 438/22, 28
See application file for complete search history.

(56) References Cited

U.S. PATENT DOCUMENTS

| | | | |
|---|---|---|---|
| 2015/0048348 A1 | 2/2015 | Huang et al. |
| 2015/0145405 A1 | 5/2015 | Yang et al. |
| 2015/0228232 A1 | 8/2015 | Lee et al. |
| 2015/0318506 A1 | 11/2015 | Zhou et al. |
| 2016/0161650 A1 | 6/2016 | Taraschi et al. |
| 2016/0190515 A1 | 6/2016 | Huang et al. |
| 2016/0276613 A1 | 9/2016 | Gu et al. |
| 2018/0138243 A1 | 5/2018 | Wang et al. |
| 2020/0133077 A1 | 4/2020 | Lin et al. |
| 2020/0357853 A1 | 11/2020 | Yan et al. |
| 2020/0393600 A1 | 12/2020 | Yu et al. |

FOREIGN PATENT DOCUMENTS

| | | |
|---|---|---|
| CN | 103236435 A | 8/2013 |
| CN | 203465442 U | 3/2014 |
| CN | 104143564 A | 11/2014 |
| CN | 105044974 A | 11/2015 |
| CN | 105990396 A | 10/2016 |
| CN | 106409876 A | 2/2017 |
| CN | 106681046 A | 5/2017 |
| CN | 107357080 A | 11/2017 |
| CN | 109545832 A | 3/2019 |
| IN | 103700785 A | 4/2014 |

OTHER PUBLICATIONS

"International Search Report and English language translation", International Application No. PCT/CN2019/121553, dated Mar. 2, 2020, 14 pp.

"Notice of Allowance and Fee(s) Due", U.S. Appl. No. 16/766,155, dated Feb. 14, 2022, 19 pp.

"Second Office Action and English language translation", CN Application No. 201811443609.0, dated Nov. 3, 2020, 27 pp.

* cited by examiner

ORGANIC LIGHT EMITTING DIODE DISPLAY SUBSTRATE HAVING BAND GAP LAYER, MANUFACTURING METHOD THEREOF, AND DISPLAY DEVICE

RELATED APPLICATIONS

The present application is a Continuation application of Ser. No. 16/766,155, filed on May 21, 2020 and entitled "ORGANIC LIGHT EMITTING DIODE DISPLAY SUBSTRATE, MANUFACTURING METHOD THEREOF, AND DISPLAY DEVICE", which itself is a 35 U.S.C. 371 national stage application of PCT International Application No. PCT/CN2019/121553, filed on Nov. 28, 2019, which itself claims the benefit of Chinese Patent Application No. 201811443609.0, filed on Nov. 29, 2018, the entire disclosures of which are incorporated herein by reference.

TECHNICAL FIELD

The present disclosure relates to the field of display technology, and in particular to an organic light emitting diode display substrate, a manufacturing method thereof, and a display device.

BACKGROUND

Organic light emitting diode (OLED) is an active light emitting display device, which has the advantages of self-luminescence, wide viewing angle, high contrast, low power consumption, and extremely high response speed. At present, for small-size OLED products, the organic electroluminescent layer is usually formed by a vapor deposition process, and the modulation effect of the optical resonator is used to achieve low power consumption and high color gamut. However, due to the expensive preparation materials and the need for fine metal mask (FMM) in the preparation process, this preparation method cannot achieve stable mass production of large-size OLED products.

Mass-produced large-size OLED products mainly use the structure including white light OLEDs and color filters, but this structure has the problems of large power consumption and insufficient color gamut. In order to solve the problems of power consumption and color gamut, the related art proposes a structure including a blue OLED, a green quantum dot color conversion layer, and a red quantum dot color conversion layer. The inventors of the present application have found that this structure not only has the problem of insufficient green and red light output, but also has the problem of a large amount of blue light in green and red light, resulting in poor color purity of the product.

SUMMARY

An embodiment of the present disclosure provides an organic light emitting diode display substrate. The organic light emitting diode display substrate includes a light emitting unit layer, a first band gap layer and a color conversion layer. The first band gap layer and the color conversion layer are disposed on a light exit path of the light emitting unit layer; the light emitting unit layer includes a first light emitting unit, a second light emitting unit, and a third light emitting unit periodically arranged on a driving substrate and emitting light of a first color; the color conversion layer is configured to convert a part of the light of the first color into light of a second color and light of a third color, respectively; the first band gap layer is disposed between the light emitting unit layer and the color conversion layer and covers the second light emitting unit and the third light emitting unit; the first band gap layer is configured to transmit the light of the first color in a light exit direction, and reflect the light of the second color and the light of the third color.

Optionally, the color conversion layer includes a second color conversion unit disposed on a light exit path of the second light emitting unit and converting the light of the first color into the light of the second color, and a third color conversion unit disposed on a light exit path of the third light emitting unit and converting the light of the first color into the light of the third color.

Optionally, the first band gap layer further covers the first light emitting unit.

Optionally, the organic light emitting diode display substrate further includes a color filter layer disposed on a light exit path of the second color conversion unit and the third color conversion unit. The color filter layer is configured to transmit the light of the second color and the light of the third color in the light exit direction and absorb the light of the first color.

Optionally, the color filter layer includes a second filter unit and a third filter unit; the second filter unit corresponds to a position of the second color conversion unit, and is configured to transmit the light of the second color in the light exit direction and absorb the light of the first color; the third filter unit corresponds to a position of the third color conversion unit, and is configured to transmit the light of the third color in the light exit direction and absorb the light of the first color.

Optionally, the first band gap layer has a transmittance of ≥80% for the light of the first color, and has a reflectivity of ≥85% for the light of the second color and the light of the third color.

Optionally, the organic light emitting diode display substrate further includes: a second band gap layer disposed on a light exit path of the second color conversion unit and the third color conversion unit. The second band gap layer is configured to transmit the light of the second color and the light of the third color in the light exit direction and reflect the light of the first color in a direction opposite to the light exit direction.

Optionally, the second band gap layer is disposed on a planarization layer covering the second color conversion unit and the third color conversion unit, and includes a second band gap unit and a third band gap unit; the second band gap unit corresponds to a position of the second color conversion unit, and is configured to transmit the light of the second color in the light exit direction and reflect the light of the first color in a direction opposite to the light exit direction; the third band gap unit corresponds to a position of the third color conversion unit, and is configured to transmit the light of the third color in the light exit direction and reflect the light of the first color in the direction opposite to the light exit direction.

Optionally, the second band gap unit has a transmittance of ≥80% for the light of the second color and a reflectivity of ≥85% for the light of the first color; the third band gap unit has a transmittance of ≥80% for the light of the third color and a reflectivity of ≥85% for the light of the first color.

Optionally, each of the first band gap layer and the second band gap layer is one of a photonic band gap layer and a stacked structure layer; a thickness of the photonic band gap layer is 0.5 µm to 2.0 µm; a thickness of the stacked structure layer is 0.5 µm to 10.0 µm, the stacked structure layer includes 3 to 5 sequentially stacked dielectric layers, and the refractive indexes of adjacent dielectric layers are different from each other.

Optionally, the light of the first color is blue light, and the color conversion layer is a quantum dot conversion layer.

An embodiment of the present disclosure further provides an organic light emitting diode display substrate. The organic light emitting diode display substrate includes a light emitting unit layer, a color conversion layer and a second band gap layer. The color conversion layer and the second band gap layer are disposed on a light exit path of the light emitting unit layer; the light emitting unit layer includes a first light emitting unit, a second light emitting unit, and a third light emitting unit periodically arranged on a driving substrate and emitting light of a first color; the color conversion layer is configured to convert a part of the light of the first color into light of a second color and light of a third color, respectively; the second band gap layer is disposed on a side of the color conversion layer away from the light emitting unit layer; the second band gap layer is configured to transmit the light of the second color and the light of the third color in a light exit direction, and reflect the light of the first color in a direction opposite to the light exit direction.

Optionally, the color conversion layer includes a second color conversion unit disposed on a light exit path of the second light emitting unit and converting the light of the first color into the light of the second color, and a third color conversion unit disposed on a light exit path of the third light emitting unit and converting the light of the first color into the light of the third color.

Optionally, the second band gap layer is disposed on a planarization layer covering the second color conversion unit and the third color conversion unit, and includes a second band gap unit and a third band gap unit; the second band gap unit corresponds to a position of the second color conversion unit, and is configured to transmit the light of the second color in the light exit direction and reflect the light of the first color in a direction opposite to the light exit direction; the third band gap unit corresponds to a position of the third color conversion unit, and is configured to transmit the light of the third color in the light exit direction and reflect the light of the first color in the direction opposite to the light exit direction; the second band gap unit has a transmittance of ≥80% for the light of the second color and a reflectivity of ≥85% for the light of the first color; the third band gap unit has a transmittance of ≥80% for the light of the third color and a reflectivity of ≥85% for the light of the first color.

Optionally, the second band gap layer is one of a photonic band gap layer and a stacked structure layer; a thickness of the photonic band gap layer is 0.5 μm to 2.0 μm; a thickness of the stacked structure layer is 0.5 μm to 10.0 μm, the stacked structure layer includes 3 to 5 sequentially stacked dielectric layers, and the refractive indexes of adjacent dielectric layers are different from each other.

Optionally, the light of the first color is blue light, and the color conversion layer is a quantum dot conversion layer.

An embodiment of the present disclosure also provides a display device including the organic light emitting diode display substrate as described above.

An embodiment of the present disclosure further provides a method for manufacturing an organic light emitting diode display substrate. The method includes: forming a light emitting unit layer that emits light of a first color, the light emitting unit layer including a first light emitting unit, a second light emitting unit, and a third light emitting unit periodically arranged on a driving substrate; and forming a first band gap layer and a color conversion layer, the first band gap layer being between the light emitting unit layer and the color conversion layer, the color conversion layer being configured to convert a part of the light of the first color into light of a second color and light of a third color, respectively; the first band gap layer being configured to transmit the light of the first color in a light exit direction, and reflect the light of the second color and the light of the third color.

Optionally, the method further includes: forming a second band gap layer, the second band gap layer being on a side of the color conversion layer away from the light emitting unit layer, and the second band gap layer being configured to transmit the light of the second color and the light of the third color in the light exit direction and reflect the light of the first color in a direction opposite to the light exit direction.

An embodiment of the present disclosure further provides a method for manufacturing an organic light emitting diode display substrate. The method includes: forming a light emitting unit layer that emits light of a first color, the light emitting unit layer including a first light emitting unit, a second light emitting unit, and a third light emitting unit periodically arranged on a driving substrate; and forming a color conversion layer and a second band gap layer, the second band gap layer being on a side of the color conversion layer away from the light emitting unit layer, and the second band gap layer being configured to transmit the light of the second color and the light of the third color in a light exit direction and reflect the light of the first color in a direction opposite to the light exit direction.

BRIEF DESCRIPTION OF THE DRAWINGS

The drawings are used to provide a further understanding of the technical solutions of the present disclosure, constitute a part of the specification, and are used to explain the technical solutions of the present disclosure together with the embodiments of the present disclosure, and do not constitute limitations on the technical solutions of the present disclosure. The shapes and sizes of the components in the drawings do not reflect the true scale, and the purpose is only to illustrate the present disclosure.

DETAILED DESCRIPTION OF THE DISCLOSURE

Figure 1A:
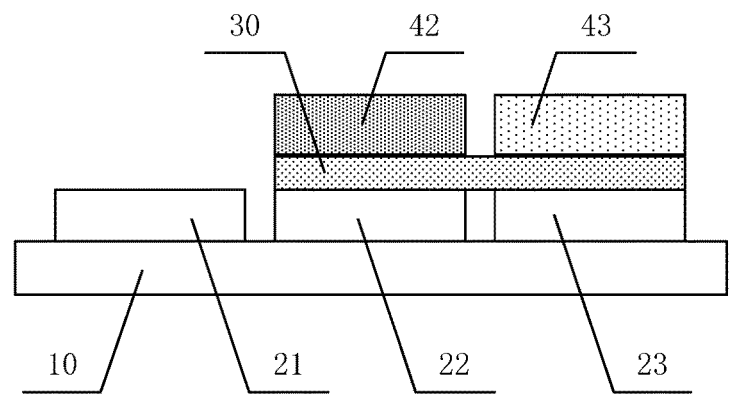
FIG. 1a is a schematic structural diagram of an embodiment of an OLED display substrate provided by the present disclosure.

The implementation of the present disclosure will be described below in more detail in combination with the drawings and the embodiments. The following embodiments are used for explanation of the present disclosure, not for limitation of the scope of the present disclosure. It should be noted that the embodiments in the present disclosure and the features in the embodiments can be arbitrarily combined with each other without conflict.

The inventors of the present application have found that in the solution including blue light OLED, green quantum dot color conversion layer, and red quantum dot color conversion layer proposed by the related art, green light is the light converted by the green quantum dot color conversion layer absorbing blue light, and red light is the light converted by the red quantum dot color conversion layer absorbing blue light. The green light emitted from the green sub-pixel and the red light emitted from the red sub-pixel conform to the traditional Lambertian. The Lambertian refers to that the incident light is reflected uniformly in all directions, that is, the incident light is centered on the incident point and reflected isotropically around the entire hemispherical space, which is called diffuse reflection, or isotropic reflection. Due to the characteristics of color conversion of quantum dots, part of the converted green and red light does not exit from the light exit surface, thus resulting in insufficient green and red light output. Insufficient green and red light output leads to increased power consumption of the product, because in order to improve the brightness of green and red light, the output of the light emitting unit needs to be increased. In addition, due to the limited absorption efficiency of quantum dot materials, and the absorption efficiency is greatly affected by the concentration, it is impossible to completely convert blue light, so green light and red light inevitably contain blue light, resulting in insufficient color purity of green light and red light, which in turn leads to insufficient product color purity.

In view of the problem of insufficient color purity of the existing solution including blue light OLED, green quantum dot color conversion layer and red quantum dot color conversion layer, the embodiments of the present disclosure provide an OLED display substrate, a manufacturing method thereof, and a display device.

The main structure of the OLED display substrate of the embodiment provided by the present disclosure includes a light emitting unit layer, a band gap layer, and a color conversion layer. The light emitting unit layer emits light of a first color. The band gap layer and the color conversion layer are disposed on the light exit path of the light emitting unit layer. The color conversion layer is configured to convert a part of the light of the first color into light of a second color and light of a third color, respectively. The band gap layer is configured to emit light of the second color and light of the third color to the light exit direction of the organic light emitting diode display substrate. The light exit direction of the organic light emitting diode display substrate is consistent with the light exit direction of the light emitting unit layer.

In particular, the light emitting unit layer includes a first light emitting unit, a second light emitting unit, and a third light emitting unit periodically arranged on a driving substrate and emitting light of the first color. The color conversion layer includes: a second color conversion unit disposed on a light exit path of the second light emitting unit and converting the light of the first color into the light of the second color, and a third color conversion unit disposed on a light exit path of the third light emitting unit and converting the light of the first color into the light of the third color. The band gap layer includes a first band gap layer and/or a second band gap layer. The first band gap layer is disposed between the light emitting unit layer and the color conversion layer, and is configured to transmit the light of the first color in the light exit direction and reflect the light of the second color and the light of the third color in the light exit direction. The second band gap layer is disposed on the light exit paths of the second color conversion unit and the third color conversion unit, and is configured to transmit the light of the second color and the light of the third color in the light exit direction and reflect the light of the first color in a direction opposite to the light exit direction.

The OLED display substrate provided by the present disclosure effectively improves the light output efficiency and light output of the light of the second color and the light of the third color by providing a band gap layer that increases the light output of the light of the second color and the light of the third color, and effectively improves the color purity of the product.

The technical solutions of the embodiments of the present disclosure are described in detail below through specific embodiments.

FIG. 1a is a schematic structural diagram of an embodiment of an OLED display substrate provided by the present disclosure, in which the OLEDs are top-emitting OLEDs. As shown in FIG. 1a, the OLED display substrate of this embodiment includes: a driving substrate 10; a first light emitting unit 21, a second light emitting unit 22, and a third light emitting unit 23 periodically arranged on the driving substrate 10; the first light emitting unit 21, the second light emitting unit 22, and the third light emitting unit 23 being capable of emitting light of the first color under the driving of the driving substrate 10; a first band gap layer 30 disposed on the second light emitting unit 22 and the third light emitting unit 23, the first band gap layer 30 being configured to transmit the light of the first color in a light exit direction, and reflect the light of the second color and the light of the third color; a second color conversion unit 42 and a third color conversion unit 43 provided on the first band gap layer 30. The second color conversion unit 42 corresponds to the position of the second light emitting unit 22 and is configured to convert the light of the first color emitted from the second light emitting unit 22 into light of the second color. The third color conversion unit 43 corresponds to the position of the third light emitting unit 23 and is configured to convert the light of the first color emitted from the third light emitting unit 23 into light of the third color.

Figure 1B:
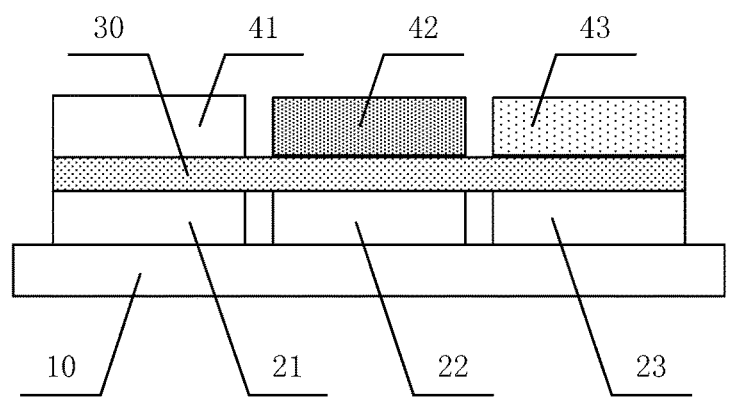
FIG. 1b is a schematic structural diagram of another embodiment of an OLED display substrate provided by the present disclosure.
Figure 1C:
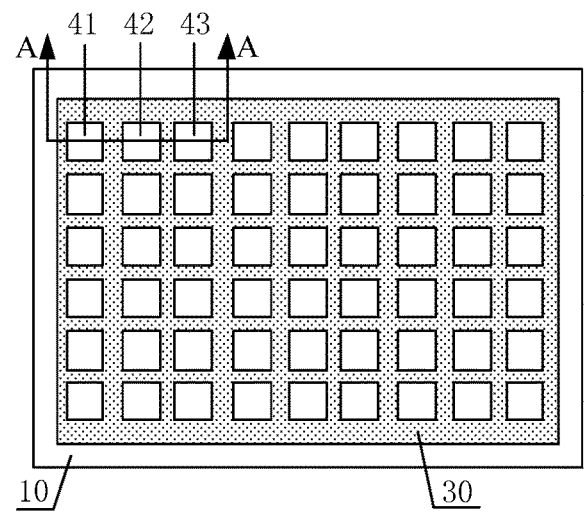
FIG. 1c is a schematic top view of the OLED display substrate shown in FIG. 1b.

FIG. 1b is a schematic structural diagram of another embodiment of an OLED display substrate provided by the present disclosure. As shown in FIG. 1b, the first band gap layer 30 may cover the first light emitting unit 21, the second light emitting unit 22, and the third light emitting unit 23. The OLED display substrate may further be provided with a first color conversion unit 41, and the first color conversion unit 41 is provided on the first band gap layer 30 at a position corresponding to the first light emitting unit 21. The first color conversion unit 41 is transparent (that is, the conversion rate is 0), and is configured to transmit blue light emitted from the first light emitting unit. FIG. 1c is a top view of the embodiment shown in FIG. 1b, and FIG. 1b is a cross-sectional view taken along line A-A in FIG. 1c.

Figure 2:
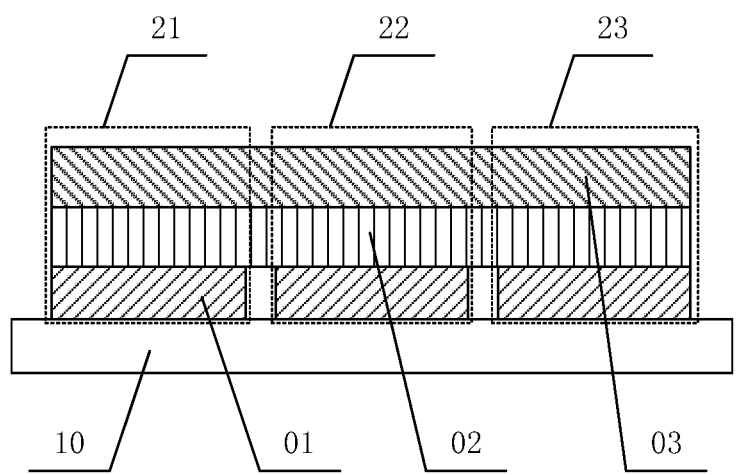
FIG. 2 is a schematic structural diagram of a light emitting unit of the embodiment shown in FIG. 1 provided by the present disclosure.

In this embodiment, the structure of the driving substrate 10 may be the same as that of the related art, and includes several pixel units arranged in a matrix manner. Each pixel unit includes three sub-pixels. The three light emitting units are respectively disposed in the light emitting regions formed by the pixel definition layer in the three sub-pixels. Each sub-pixel includes a thin film transistor driving the light emitting unit to realize light emission. The thin film transistor includes an active layer, a gate insulating layer, a gate electrode, an interlayer insulating layer, a source electrode and a drain electrode, which will not be repeated here. FIG. 2 is a schematic structural diagram of the light emitting unit of the embodiment shown in FIGS. 1a to 1c. Each light emitting unit includes a first electrode 01, an organic electroluminescent layer 02, and a second electrode 03. The organic electroluminescent layer 02 is provided between the first electrode 01 and the second electrode 03. The organic electroluminescent layer 02 includes an organic light emitting layer, which can emit light of the first color under the driving of the electric field between the first electrode and the second electrode. For the top emission structure, the first electrode is a reflective electrode, the second electrode is a transmissive electrode or a transflective electrode; for the bottom emission structure, the first electrode is a transmissive electrode or a transflective electrode, and the second electrode is a reflective electrode. In actual implementation, the organic electroluminescent layer may include an electron transport layer and a hole transport layer in addition to the organic light emitting layer. Further, in order to improve the efficiency of injecting electrons and holes into the light emitting layer, the organic electroluminescent layer may further include an electron injection layer disposed between the cathode and the electron transport layer, and a hole injection layer provided between the anode and the hole transport layer.

As shown in FIG. 2, since the three light emitting units all emit light of the first color, the organic electroluminescent layer 02 of the three light emitting units may have an integrated structure. The second electrode 03 of the three light emitting units may also have an integrated structure. In this embodiment, an organic electroluminescent layer with an integrated structure is provided. The organic electroluminescent layer may be formed by an evaporation process without using a mask, which does not require the use of FMM, reduces costs, and simplifies the process.

In the above embodiment, the first band gap layer 30 has a transmittance of ≥80% for the light of the first color and a reflectivity of ≥85% for the light of the second color and the light of the third color. Optionally, the first band gap layer 30 has a transmittance of ≥90% for the light of the first color. Optionally, the first band gap layer 30 has a reflectivity of ≥95% for the light of the second color and the light of the third color.

Figure 3A:
FIG. 3a and FIG. 3b are schematic structural diagrams of the first band gap layer of the embodiment shown in FIG. 1 provided by the present disclosure.
Figure 3B:
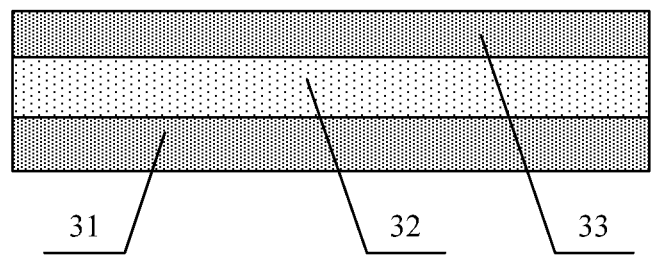

FIG. 3a and FIG. 3b are schematic structural diagrams of the first band gap layer of the embodiments shown in FIGS. 1a-1c provided by the present disclosure. As shown in FIG. 3a, the first band gap layer 30 of this embodiment may be a photonic band gap (PBG) layer or an electromagnetic band gap (EBG) layer, with a thickness of 0.5 μm to 2.0 μm. The photonic band gap PBG is a periodic structure composed of a periodic arrangement of a medium in another medium, also known as a photonic crystal structure. The characteristic of the photonic band gap is that waves in a certain frequency range cannot propagate in its periodic structure, that is, there is a "forbidden band" in the photonic crystal structure itself, so that light of a certain color can be transmitted and light of other colors can be reflected. In the same way, the electromagnetic band gap EBG is a periodically arranged array structure composed of a mixture of dielectric and metal, which has obvious band stop characteristics and can control the propagation of electromagnetic waves. In actual implementation, the photonic band gap layer or the electromagnetic band gap layer in this embodiment may be prepared in multiple ways by using one or more of the well-known dielectric rod stacking, precision mechanical drilling, colloidal particle self-organization growth, colloidal solution self-organization growth, and semiconductor technology. The base material of the photonic band gap layer may be an inorganic material or an organic material. When an inorganic material is used as the base material, the inorganic material can simultaneously serve as a protective layer for the three light emitting units, blocking elements such as water and oxygen in the environment. When an organic material is used as the base material, a protective layer may be additionally provided between the three light emitting units and the photonic band gap layer, and the protective layer provides protection for the three light emitting units.

The first band gap layer 30 of this embodiment may also be a stacked structure layer forming a two-dimensional photonic crystal structure. The stacked structure layer includes a multi-layer structure in which a plurality of dielectric layers are sequentially stacked. The refractive indexes of adjacent dielectric layers are different from each other. The multiple dielectric layers with refractive index difference are used to achieve high transmission for the light of the first color and high reflectivity for the light of the second color and the light of the third color. In actual implementation, any combination of inorganic layers and/or organic layers may be used for the dielectric layer. The material of the inorganic layer may be silicon nitride ($SiN_x$), silicon oxide ($SiO_2$), silicon carbide (SiC), sapphire ($Al_2O_3$), zinc sulfide (ZnS), or zinc oxide (ZnO), which has water and oxygen barrier properties, so that the inorganic layer can be used as the encapsulation layer of the layer of the light emitting units. The material of the organic layer may be polyvinyl pyrrolidone (PVP), polyvinyl alcohol (vinylalcohol polymer, PVA), 8-hydroxyquinoline aluminum (Alq), N,N'-diphenyl-N,N'-(1-naphthyl)-1,1'-biphenyl-4,4'-diamine (NPB) or HATCN, etc., so that the organic layer can also be used as a stress relief layer. In this embodiment, the stacked structure has 3 to 5 layers, with a thickness of 0.5 μm to 10.0 μm, and the refractive index of the stacked structure material is 1.3 to 2.4. As shown in FIG. 3b, the stacked structure layer includes a first inorganic layer 31, a first organic layer 32, and a second inorganic layer 33 stacked in sequence. In this structure, the first inorganic layer 31 is provided on the layer of the light emitting units and in contact with the three light emitting units, and can simultaneously serve as a protective layer for the three light emitting units, blocking elements such as water and oxygen in the environment. Of course, the stacked structure layer may also include an organic layer, an inorganic layer and an organic layer stacked in sequence. In this structure, a protective layer may be additionally provided between the three light emitting units and the organic layer, and the protective layer provides protection for the three light emitting units. Further, the stacked structure layer may also include multiple inorganic layers stacked in sequence. In actual implementation, the refractive index and thickness of each dielectric layer can be designed as required to achieve the characteristics of high transmittance for the light of the first color and high reflectivity for the light of the second color and the light of the third color.

In this embodiment, the color conversion layer may be a quantum dot conversion layer. Quantum dots (QDs), also known as nanocrystals, are nanoparticles composed of II-VI or III-V elements. The particle size of quantum dots is generally between 1 and 20 nm. Due to the quantum confinement of electrons and holes, the continuous energy band structure becomes a discrete energy level structure with molecular characteristics, which can emit fluorescence after excitation. The emission spectrum of quantum dots can be controlled by changing the size of the quantum dots. By changing the size of the quantum dots and their chemical composition, their emission spectrum can cover the entire visible light region. The material of quantum dots can be at least one of zinc oxide, graphene, cadmium selenide (CdSe), cadmium sulfide (CdS), cadmium telluride (CdTe), zinc selenide (ZnSe), zinc telluride (ZnTe) and zinc sulfide (ZnS). Taking CdTe quantum dots as an example, when its particle size grows from 2.5 nm to 4.0 nm, the emission wavelength can be shifted from 510 nm to 660 nm. In this embodiment, the second color conversion unit 42 may be a transparent material layer doped with quantum dots of the second color. After the light of the first color from the second light emitting unit 22 is incident on the second color conversion unit 42, the quantum dots of the second color are excited by the light of the first color and emit light of the second color, realizing the conversion of the light of the first color into the light of the second color. The third color conversion unit 43 may be a transparent material layer doped with quantum dots of the third color. After the light of the first color from the third light emitting unit 23 is incident on the third color conversion unit 43, the quantum dots of the third color are excited by the light of the first color and emit light of the third color, realizing the conversion of the light of the first color into the light of the third color. In actual implementation, the second color conversion unit 42 and the third color conversion unit 43 may also be quantum rods conversion layers, or other forms of light color conversion materials. The conversion principle of the quantum rod conversion layer is similar to the quantum dot conversion layer, and the light color conversion material may be cyanine dyes such as 4-dicyanomethylene-2-methyl-6-(p-dimethylaminostyryl)-4H-pyran (DCM-1), DCM-2, and DCJTB, 4,4-difluoro-1,3,5,7-tetraphenyl-4-bora-3a, 4a-diaza-s-indacene, Lumogen red and Nile red etc. The quantum dot conversion layer, quantum rod conversion layer, or light color conversion material used in this embodiment are all mature technologies, and their composition, structure, and preparation are well known to those skilled in the art, which will not be repeated here.

In actual implementation, the light of the first color may be blue light, green light or red light, the light of the second color may be different from the light of the first color, and the light of the third color may be different from the light of the first color and the light of the second color, which can be designed according to actual needs. Considering that the energy of blue light is higher than the energy of red light and green light, it is easier to convert high-energy blue light into low-energy green light or red light. Therefore, in the embodiment, the first light emitting unit 21, the second light emitting unit 22, and the third light emitting unit 23 are blue light emitting units, that is, the light of the first color is blue light; the second color conversion unit 42 is a conversion unit that converts blue light into green light, that is, the light of the second color is green light; the third color conversion unit 43 is a conversion unit that converts blue light into red light, that is, the light of the third color is red light.

Figure 4:
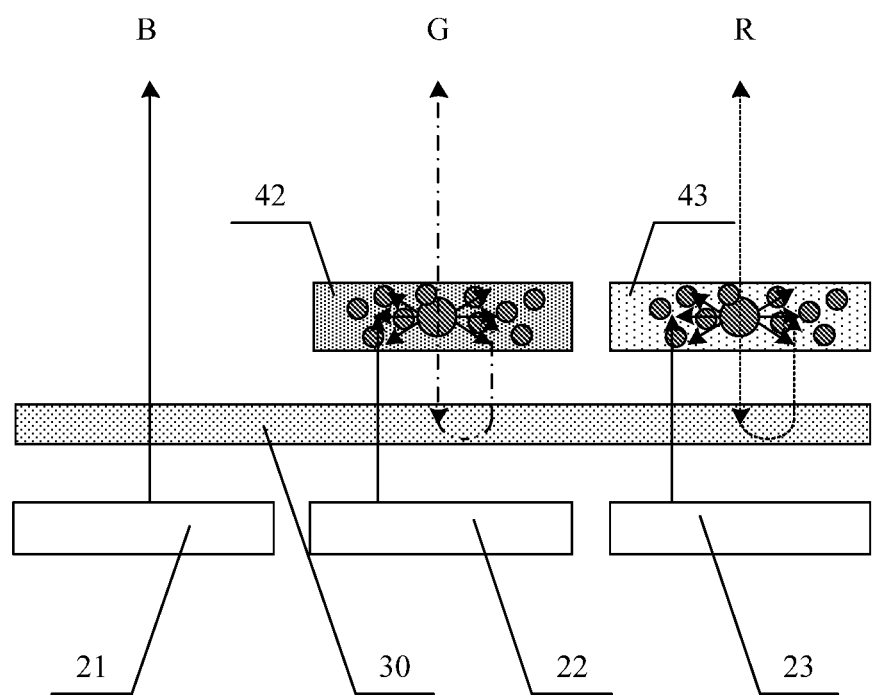
FIG. 4 is a working principle diagram of the first band gap layer of the embodiment shown in FIG. 1 provided by the present disclosure.

FIG. 4 is a working principle diagram of the first band gap layer of the embodiment shown in FIG. 1 provided by the present disclosure. As shown in FIG. 4, the first light emitting unit 21, the second light emitting unit 22, and the third light emitting unit 23 emit blue light, which is represented by a solid line; the second color conversion unit 42 converts the blue light into green light, and the green light is represented by a dot dash line; the third color conversion unit 43 converts blue light into red light, and the red light is represented by a dotted line. Since the first band gap layer 30 has a high transmittance for blue light, the blue light emitted by the first light emitting unit 21, the second light emitting unit 22, and the third light emitting unit 23 passes through the first band gap layer 30 and remains blue light. After the blue light transmitted by the first band gap layer 30 is incident on the second color conversion unit 42, the green quantum dots in the second color conversion unit 42 are excited by the blue light to emit green light, and a part of the green light is emitted from the light exit surface of the second color conversion unit 42 (the surface away from the surface of the first band gap layer 30), while another part of the green light exits from the light entrance surface of the second color conversion unit 42 (the surface adjacent to the first band gap layer 30) and is incident on the first band gap layer 30. Since the first band gap layer 30 has a high reflectivity for green light, the green light entering the first band gap layer 30 is reflected back to the second color conversion unit 42 and exits from the light exit surface of the second color conversion unit 42. In this way, the first band gap layer 30 reflects the green light, so that substantially all the green light converted by the second color conversion unit 42 exits from the light exit surface of the second color conversion unit 42, which effectively improves the green light output and the green light output efficiency, increasing light brightness. Similarly, after the blue light transmitted by the first band gap layer 30 enters the third color conversion unit 43, the red quantum dots in the third color conversion unit 43 are excited by blue light to emit red light, and a part of the red light is emitted from the light exit surface of the third color conversion unit 43 (the surface away from the surface of the first band gap layer 30), while another part of the red light exits from the light entrance surface of the third color conversion unit 43 (the surface adjacent to the first band gap layer 30) and is incident on the first band gap layer 30. Since the first band gap layer 30 has a high reflectivity for red light, the red light entering the first band gap layer 30 is reflected back to the third color conversion unit 43 and exits from the light exit surface of the third color conversion unit 43. In this way, the first band gap layer 30 reflects the red light, so that substantially all the red light converted by the third color conversion unit 43 exits from the light exit surface of the third color conversion unit 43, which effectively improves the red light output and the red light output efficiency, increasing light brightness. In addition, if the red and green light output brightness of this embodiment is set to be the same as the red and green light output brightness of the existing structure, this embodiment can reduce the blue light emission of the second light emitting unit 22 and the third light emitting unit 23, and thus can effectively reduce power consumption.

Further, due to the limitation of the quantum dot material, after the blue light transmitted by the first band gap layer 30 is incident on the second color conversion unit 42 and the third color conversion unit 43, a small amount of blue light may not be converted into green light and red light. A part of this small amount of blue light may exit from the light incident surfaces of the second color conversion unit 42 and the third color conversion unit 43, and enter the first band gap layer 30. Since the first band gap layer 30 has a high transmittance for blue light, this part of blue light is transmitted from the first band gap layer 30 and does not return to the second color conversion unit 42 and the third color conversion unit 43 anymore. In this way, due to the transmission of blue light by the first band gap layer 30, the amount of blue light in the green light and red light emitted by the second color conversion unit 42 and the third color conversion unit 43 is reduced, thereby improving the color purity of green light and red light.

Although the embodiment has been described with top-emitting OLEDs, the solution of this embodiment is also applicable to bottom-emitting OLEDs or double-sided emitting OLEDs. It can be seen from the above description that the OLED display substrate of this embodiment can be adjusted in various ways. For example, according to actual needs, other transparent layers may be provided between the light emitting unit layer and the first band gap layer, and between the first band gap layer and the color conversion layer.

In this embodiment, the first band gap layer is provided between the light emitting unit layer and the color conversion layer, the first band gap layer transmits the light of the first color and reflects the light of the second color and the light of the third color. Therefore, all the light converted by the color conversion layer is emitted from the sub-pixels to the maximum extent, which effectively improves the light output and the light output efficiency for the light of the second color and the light of the third color, thereby improving the light output brightness. At the same time, the content of the light of the first color in the light of the second color and the light of the third color decreases, improving the color purity of the light of the second color and the light of the third color, and improving the display quality.

Figure 5:
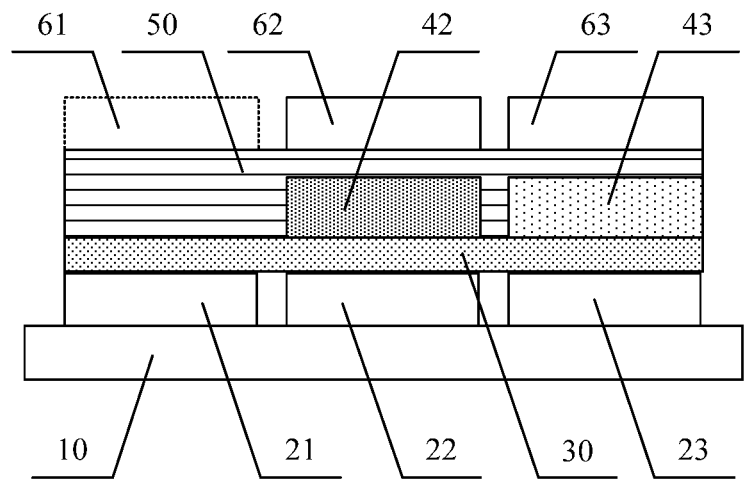
FIG. 5 is a schematic structural diagram of another embodiment of an OLED display substrate provided by the present disclosure.

FIG. 5 is a schematic structural diagram of another embodiment of an OLED display substrate provided by the present disclosure. This embodiment is an extension of the embodiment shown in FIG. 1b (since the first color conversion unit is optional, the first color conversion unit 41 in FIG. 1b is omitted in FIG. 5). This embodiment is also provided with a color filter layer. As shown in FIG. 5, the OLED display substrate of this embodiment includes: a driving substrate 10; a first light emitting unit 21, a second light emitting unit 22, and a third light emitting unit 23 arranged periodically on the driving substrate 10; the light emitting unit 21, the second light emitting unit 22, and the third light emitting unit 23 being capable of emitting light of the first color under the driving of the driving substrate 10; a first band gap layer 30 disposed on the light emitting unit 21, the second light emitting unit 22, and the third light emitting unit 23, and configured to transmit the light of the first color and reflect the light of the second color and the light of the third color in the light exit direction; a second conversion unit 42 and a third color conversion unit 43 disposed on the first band gap layer 30; the second color conversion unit 42 corresponding to the position of the second light emitting unit 22 and being configured to convert the light of the first color emitted from the second light emitting unit 22 into the light of the second color; the third color conversion unit 43 corresponding to the position of the third light emitting unit 23 and being configured to convert the light of the first color emitted from the third light emitting unit 23 into the light of the third color; a planarization layer 50 covering the first band gap layer 30, the second color conversion unit 42 and the third color conversion unit 43; a color filter layer including a second filter unit 62 and a third filter unit 63 provided on the planarization layer 50, the second filter unit 62 corresponding to the position of the second color conversion unit 42 and being configured to transmit the light of the second color in the light exit direction and absorb the light of the first color; the third filter unit 63 corresponding to the position of the third color conversion unit 43 and being configured to transmit the light of the third color in the light exit direction and absorb the light of the first color. In this embodiment, the color filter (CF) layer may be made of an organic material. The composition, structure, and preparation of the color filter layer are well known to those skilled in the art, and will not be repeated here.

This embodiment can achieve the technical effects of the embodiments shown in FIGS. 1a to 1c, including improving the light output and light output efficiency of the light of the second color and the light of the third color, and improving the color purity of the light of the second color and the light of the third color. In the embodiment shown in FIGS. 1a to 1c, the light of the first color cannot be completely converted by the second color conversion unit 42 and the third color conversion unit 43. The light of the second color emitted from the second color conversion unit 42 and the light of the third color emitted from the third color conversion unit 43 may contain unconverted light of the first color. Therefore, in this embodiment, the second filter unit 62 and the third filter unit 63 are provided on the light exit path of the second color conversion unit 42 and the third color conversion unit 43 to absorb unconverted light of the first color, further improving the color purity of the light of the second color and the light of the third color. In addition, by providing the color filter layer in this embodiment, it is also possible to effectively reduce the incidence of external light on the color conversion layer and reduce the interference of external light.

Table 1 shows the comparison test results of the brightness of the light emitted from an embodiment of the present disclosure and a comparative example. In Table 1, R represents red light, G represents green light, B represents blue light, Brightness represents brightness of the light, CIEx and CIEy represent CIE color space coordinates, and DCI-P3 color gamut is a parameter that describes the color richness of the display. Item 1 is a comparative example using a quantum dot conversion layer QDs and a color filter layer CF. Item 2 is an embodiment of the present disclosure using a first band gap layer PBG1, a quantum dot conversion layer QDs, and a color filter layer CF. The structure of the comparative example is different from the structure of the embodiment of the present disclosure in that the first band gap layer is not provided in the structure of the comparative example. As shown in Table 1, under the condition that the amount of blue light emitted from the three light emitting units is constant, the brightness of the three colors of the comparative example is set to 100%. The brightness of the output red light R of the embodiment of the present disclosure is 135%, the brightness of the output green light G of the embodiment of the present disclosure is 133%, which are greater than those of the comparative example. Meanwhile, the CIE color space coordinates and DCI-P3 color gamut of the red, green and blue light of the embodiment of the present disclosure are similar to the comparative example. The reason for the slight decrease in the brightness of the output blue light in the embodiment of the present disclosure is that the first band gap layer is provided, and the first band gap layer cannot yet realize 100% transmission for blue light. In view of this, in actual implementation, the first band gap layer may not be provided at the position corresponding to the first light emitting unit, and the first band gap layer is only provided at the position corresponding to the second light emitting unit and the third light emitting unit. The comparison test results show that the embodiment of the present disclosure effectively improves the light output and the light output efficiency of red light and green light.

at least a second band gap unit 72 and a third band gap unit 73; the second band gap unit 72 corresponding to the position of the second color conversion unit 42, the second band gap unit 72 being configured to transmit the light of the second color in the light exit direction and reflect the light of the first color in the direction opposite to the light exit direction; the third band gap unit 73 corresponding to the position of the third color conversion unit 43, the third band gap unit 73 being configured to transmit the light of the third color in the light exit direction and reflect the light of the first color in the direction opposite to the light exit direction.

TABLE 1 the brightness of output light of the embodiment of the present disclosure and comparative example

| Item | Structural features | R | | | G | | | B | | | DCI-P3 color gamut |
|---|---|---|---|---|---|---|---|---|---|---|---|
| | | Brightness | CIEx | CIEy | Brightness | CIEx | CIEy | Brightness | CIEx | CIEy | |
| 1 | QDs + CF | 100% | 0.706 | 0.293 | 100% | 0.203 | 0.757 | 100% | 0.145 | 0.035 | 100% |
| 2 | PBG1 + QDs + CF | 135% | 0.706 | 0.293 | 133% | 0.203 | 0.757 | 81% | 0.146 | 0.031 | 100% |

Similarly, on the basis of the embodiment shown in FIG. 5, the OLED display substrate of the embodiment of the present disclosure can be modified in various ways. For example, a first filter unit 61 may also be provided. The position of the first filter unit 61 corresponds to the position of the first light emitting unit 21, and the first filter unit 61 is configured to transmit the light of the first color in the light exit direction and improve the color purity of the light of the first color.

Figure 6:
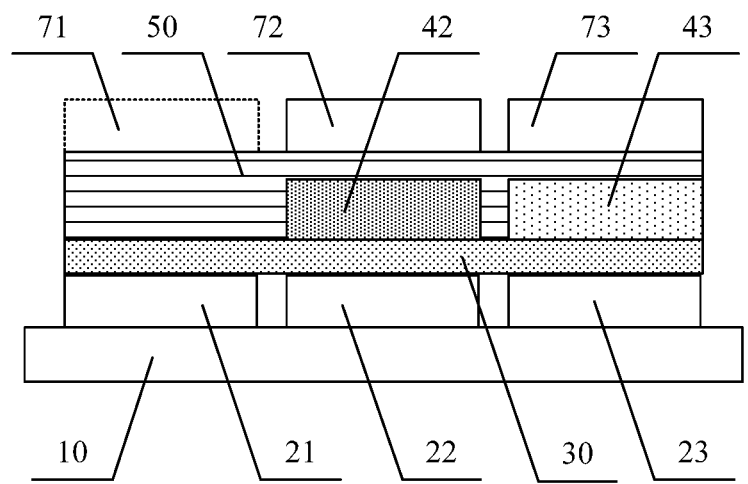
FIG. 6 is a schematic structural diagram of yet another embodiment of an OLED display substrate provided by the present disclosure.

FIG. 6 is a schematic structural diagram of yet another embodiment of an OLED display substrate provided by the present disclosure. The embodiment of the present disclosure is another modification of the embodiment shown in FIG. 1b (since the first color conversion unit is optional, the first color conversion unit 41 in FIG. 1b is omitted in FIG. 6), A second band gap layer is also provided in the embodiment of the present disclosure. As shown in FIG. 6, the OLED display substrate of the embodiment of the present disclosure includes: a driving substrate 10; a first light emitting unit 21, a second light emitting unit 22, and a third light emitting unit 23 periodically arranged on the driving substrate 10; the light emitting unit 21, the second light emitting unit 22, and the third light emitting unit 23 being capable of emitting light of the first color under the driving of the driving substrate 10; a first band gap layer 30 disposed on the light emitting unit 21, the second light emitting unit 22, and the third light emitting unit 23, and configured to transmit the light of the first color and reflect the light of the second color and the light of the third color in the light exit direction; a second conversion unit 42 and a third color conversion unit 43 disposed on the first band gap layer 30; the second color conversion unit 42 corresponding to the position of the second light emitting unit 22 and being configured to convert the light of the first color emitted from the second light emitting unit 22 into the light of the second color; the third color conversion unit 43 corresponding to the position of the third light emitting unit 23 and being configured to convert the light of the first color emitted from the third light emitting unit 23 into the light of the third color; a planarization layer 50 covering the first band gap layer 30, the second color conversion unit 42 and the third color conversion unit 43; a second band gap layer disposed on the planarization layer 50, the second band gap layer including In this embodiment, each of the second band gap unit 72 and the third band gap unit 73 may be a photonic band gap PBG layer/electromagnetic band gap EBG layer, or a stacked structure layer. The structure, reflection principle, etc. of the second band gap unit 72 and the third band gap unit 73 are substantially the same to those of the first band gap layer in the embodiments shown in FIGS. 1a to 1c. The second band gap unit 72 has a transmittance of ≥80% for light of the second color and a reflectivity of ≥85% for light of the first color. Optionally, the second band gap unit 72 has a transmittance of ≥90% for light of the second color. Optionally, the second band gap unit 72 has a reflectivity of ≥95% for the light of the first color. The third band gap unit 73 has a transmittance of ≥80% for the light of the third color and a reflectivity of ≥85% for the light of the first color. Optionally, the third band gap unit 73 has a transmittance of ≥90% for the light of the third color. Optionally, the third band gap unit 73 has a reflectivity of ≥95% for the light of the first color.

This embodiment can achieve the technical effects of the embodiments shown in FIGS. 1a to 1c, including improving the light output and light output efficiency of the light of the second color and the light of the third color, and improving the color purity of the light of the second color and the light of the third color. In the embodiment shown in FIGS. 1a to 1c, the light of the first color cannot be completely converted by the second color conversion unit 42 and the third color conversion unit 43. The light of the second color emitted from the second color conversion unit 42 and the light of the third color emitted from the third color conversion unit 43 may contain unconverted light of the first color. Therefore, in this embodiment, the second band gap unit 72 and the third band gap unit 73 are provided on the light exit path of the second color conversion unit 42 and the third color conversion unit 43, thereby reflecting unconverted light of the first color to the color conversion layer and converting light of the first color again, further improving the light output and light output efficiency of the light of the second color and the light of the third color, and improving the color purity of the light of the second color and the light of the third color. In addition, by providing the second band gap layer in this embodiment, it is also possible to effectively reduce the incidence of external light on the color conversion layer and reduce the interference of external light.

Figure 7:
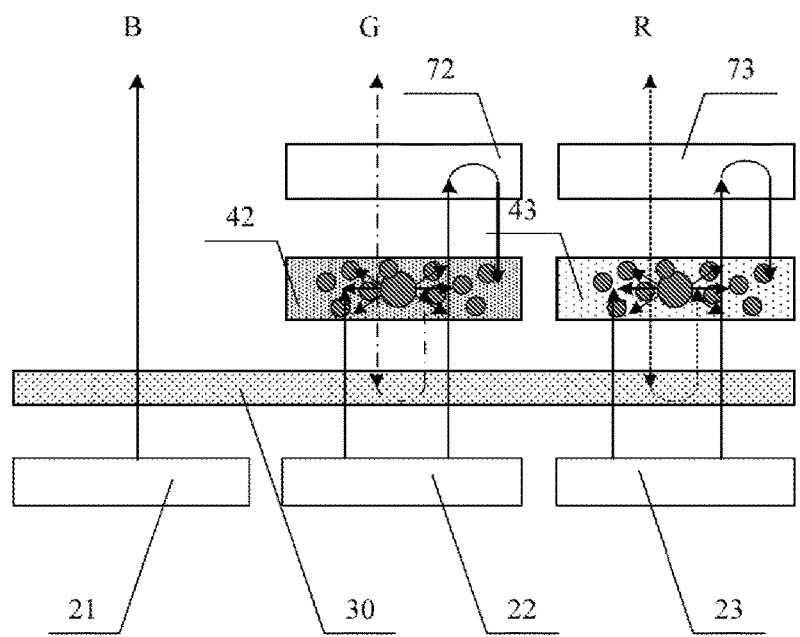
FIG. 7 is a working principle diagram of the second band gap layer of the embodiment shown in FIG. 6 provided by the present disclosure.

FIG. 7 is a working principle diagram of the second band gap layer of the embodiment shown in FIG. 6 provided by the present disclosure. As shown in FIG. 7, the working principle of the light emitting unit layer, the first band gap layer, and the color conversion layer are the same as the embodiment in FIG. 1 (as shown in FIG. 4), and details are not repeated here. Due to the limitation of the quantum dot material, after the light of the first color transmitted through the first band gap layer 30 enters the second color conversion unit 42 and the third color conversion unit 43, a small amount of the light of the first color will not be converted into light of the second color and light of the third color. A part of this small amount of light of the first color may exit from the light exit surfaces of the second color conversion unit 42 and the third color conversion unit 43, and enter the second band gap unit 72 and the third band gap unit 73. Since the second band gap unit 72 and the third band gap unit 73 has a high transmittance for light of the first color, the second band gap unit 72 and the third band gap unit 73 reflect this part of light of the first color back to the second color conversion unit 42 and the third color conversion unit 43 and conversion is performed again. In this way, the second band gap unit 72 and the third band gap unit 73 reflect the light of the first color, the unconverted light of the first color can be continuously converted until the light of the first color is completely converted into the light of the second color and the light of the third color. The conversion efficiency is maximized, the light of the first color mixed in both the light of the second color and the light of the third color is minimized, and the light output and the light output efficiency of the light of the second color and the light of the third color are maximized. The color purity is also maximized.

The color filter layer in the embodiment shown in FIG. 5 absorbs the unconverted blue light, and the second band gap layer in this embodiment reflects the unconverted blue light back to the color conversion unit for conversion again. Compared with the embodiment shown in FIG. 5, this embodiment has higher conversion efficiency, higher light output and light output efficiency, and higher color purity.

Similarly, on the basis of the solutions of the embodiments shown in FIGS. 1a-1c, the OLED display substrate of this embodiment can be modified in various ways. For example, a first band gap unit 71 may also be provided. The position of the first band gap unit 71 corresponds to the position of the first light emitting unit 21, and the first band gap unit 71 is configured to transmit the light of the first color in the light exit direction and improve the color purity of the light of the first color.

Table 2 shows the comparison test results of the output light brightness of the embodiment of the present disclosure and the comparative example. In Table 2, the meanings of R, G, B, Brightness, CIEx, CIEy, and DCI-P3 color gamut are the same as those in Table 1 above. Item 1 is a comparative example, using a quantum dot conversion layer QDs and a color filter layer CF. Item 2 is the embodiment shown in FIG. 5, which uses the first band gap layer PBG1, the quantum dot conversion layer QDs, and the color filter layer CF. Item 3 is the present embodiment, using the first band gap layer PBG1, the quantum dot conversion layer QDs, and the second band gap layer PBG2. As shown in Table 2, under the condition that the amount of blue light emitted from the three light emitting units is constant, the brightness of the three colors in the comparative example is set to 100%. The brightness of the output red light R in the embodiment shown in FIG. 5 is 135%, while the brightness of the output red light R of the present embodiment is 179%; the brightness of the output green light of the embodiment shown in FIG. 5 is 133%, and the brightness of the output green light of the present embodiment is 209%. Both the brightness of the output red light and the brightness of the output green light are significantly larger than those of the embodiment shown in FIG. 5. For blue light B, the brightness of the output blue light of the embodiment shown in FIG. 5 is 81%, while the brightness of the output blue light of the present embodiment is 220%. Meanwhile, the CIE color space coordinates and DCI-P3 color gamut of the red, green and blue light of the present embodiment are similar to the comparative example. The comparison test results show that this embodiment not only effectively improves the light output and output efficiency of red and green light, but also effectively improves the conversion efficiency. Without substantially reducing the color purity and color gamut of blue light, the second band gap layer effectively improves the brightness of blue light.

TABLE 2 the brightness of output light of the embodiment of the present disclosure and comparative example

| Item | Structural features | R | | | G | | | B | | | DCI-P3 color gamut |
|---|---|---|---|---|---|---|---|---|---|---|---|
| | | Brightness | CIEx | CIEy | Brightness | CIEx | CIEy | Brightness | CIEx | CIEy | |
| 1 | QDs + CF | 100% | 0.706 | 0.293 | 100% | 0.203 | 0.757 | 100% | 0.145 | 0.035 | 100% |
| 2 | PBG1 + QDs + CF | 135% | 0.706 | 0.293 | 133% | 0.203 | 0.757 | 81% | 0.146 | 0.031 | 100% |
| 3 | PBG1 + QDs + PBG2 | 179% | 0.681 | 0.301 | 209% | 0.223 | 0.667 | 220% | 0.144 | 0.047 | 90% |

Figure 8A:
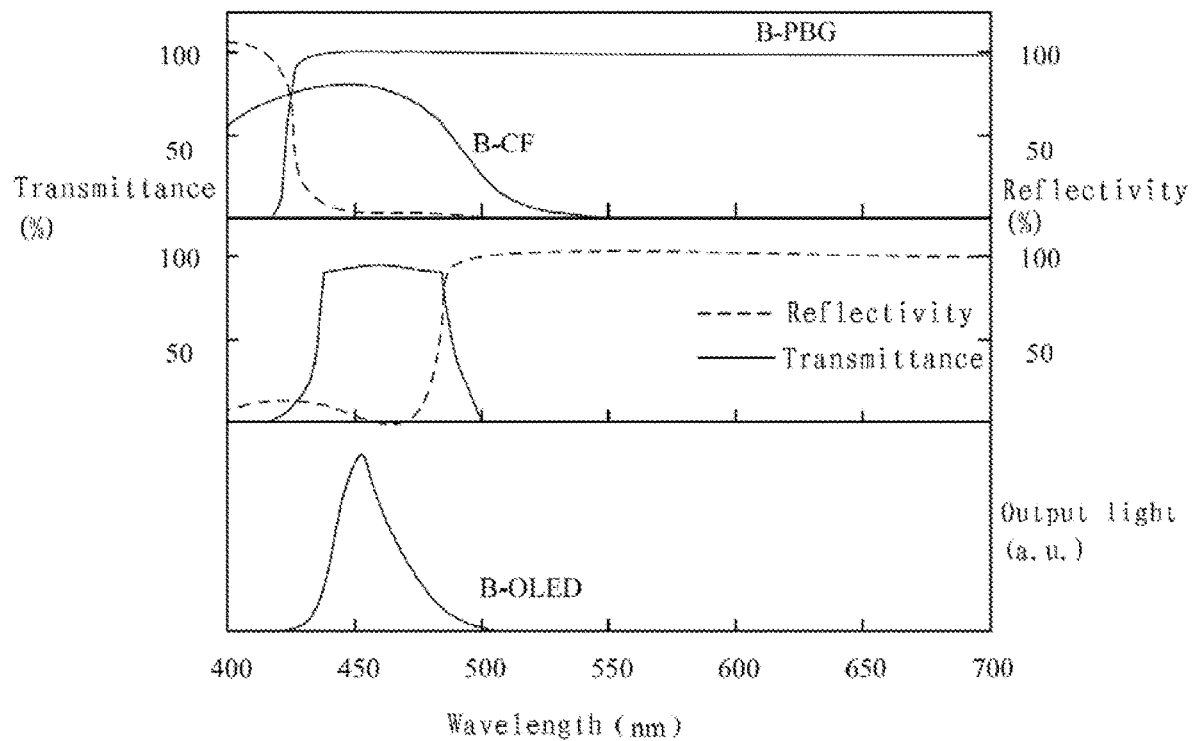
FIG. 8a, FIG. 8b, and FIG. 8c are spectrum diagrams of the embodiment shown in FIG. 6 provided by the present disclosure.
Figure 8B:
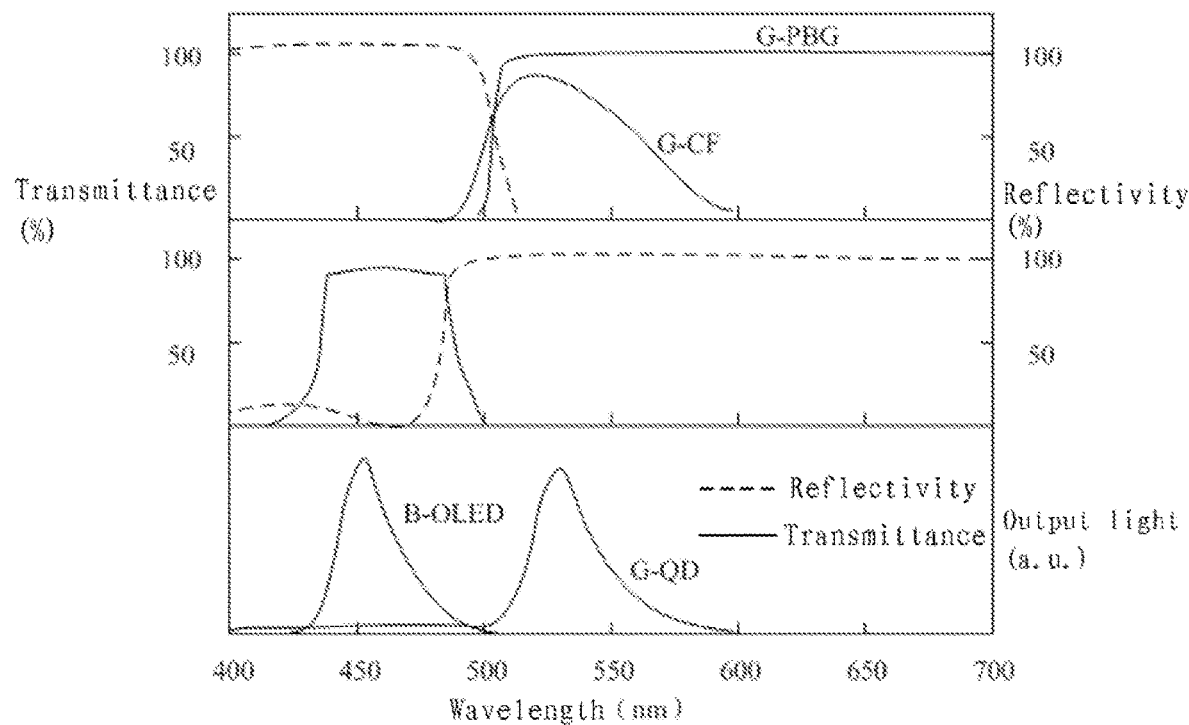
Figure 8C:
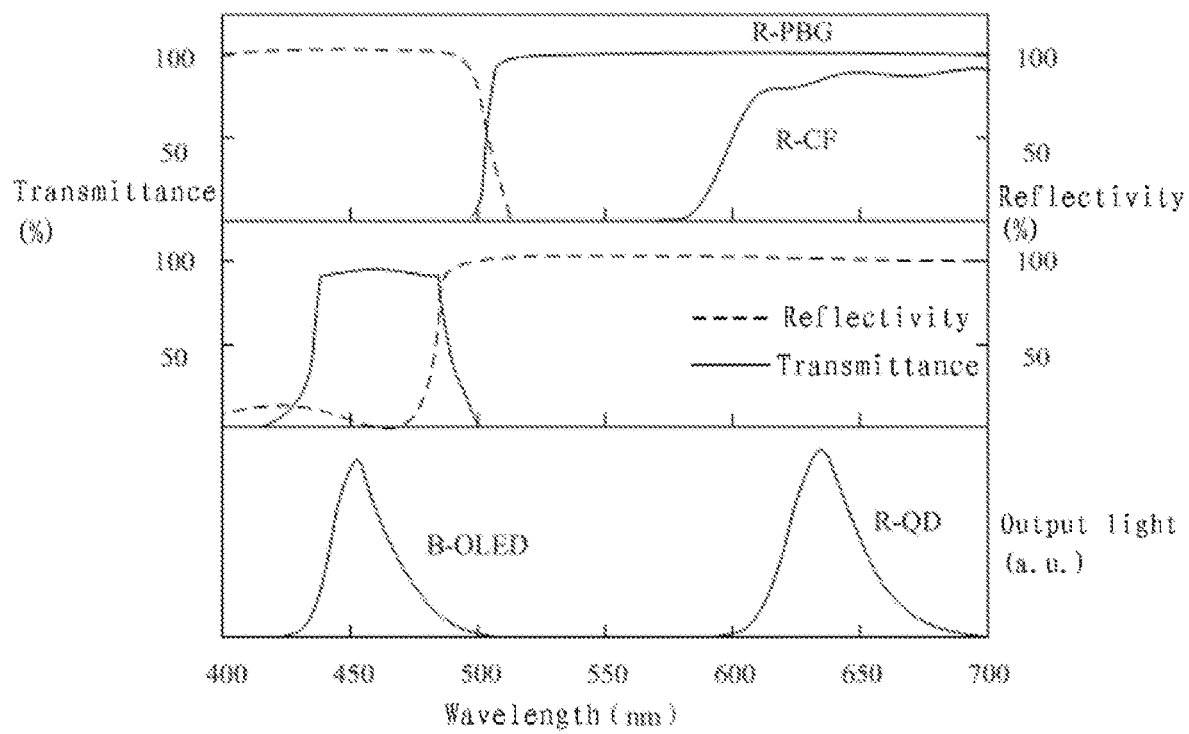

FIGS. 8a, 8b, and 8c are spectrum diagrams of the embodiment shown in FIG. 6 provided by the present disclosure. In each figure, the lower part illustrates the light emitted from the light emitting unit layer and the color conversion layer, the middle part illustrates the transmitted light and reflected light of the first band gap layer, and the upper part illustrates the comparison of the transmitted light and the reflected light between the color filter layer (the embodiment shown in FIG. 5) and the second band gap layer (this embodiment). The solid line is the transmittance, and the dotted line is the reflectivity. B-CF, G-CF, and R-CF respectively represent the blue filter layer, the green filter layer, and the red filter layer. B-PBG, G-PBG and R-PBG represent the first band gap unit (blue light), the second band gap unit (green light) and the third band gap unit (red light), respectively. B-OLED means blue light emitted from the light emitting unit. G-QD and R-QD represent green light and red light converted by the color conversion unit, respectively. As shown in FIGS. 8a, 8b, and 8c, the first band gap layer has a higher transmittance for blue light and a higher reflectivity for green and red light. The first band gap unit has a higher transmittance for blue light, and the bandwidth of the emitted blue light is greater than that of the blue filter layer. The second band gap unit has a higher transmittance for green light and a higher reflectivity for blue light, and the bandwidth of emitted green light is greater than that of the green filter layer. The third band gap unit has a higher transmittance for red light and a higher reflectivity for blue light, and the bandwidth of the emitted red light is greater than that of the red filter layer.

Figure 9:
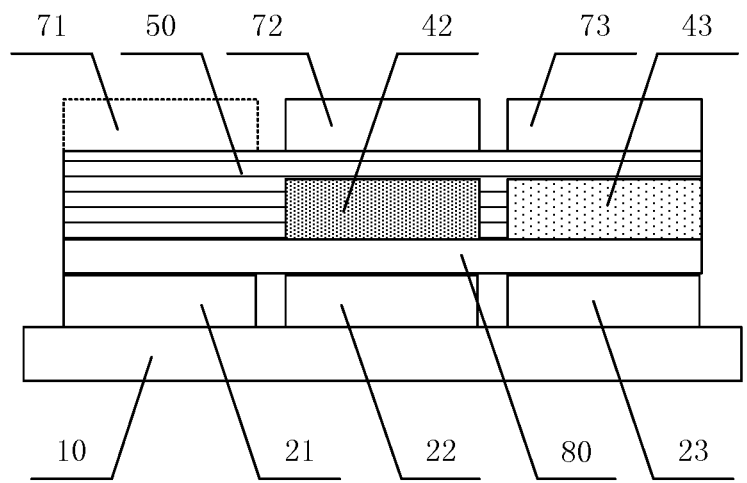
FIG. 9 is a schematic structural diagram of still another embodiment of an OLED display substrate provided by the present disclosure.

FIG. 9 is a schematic structural diagram of still another embodiment of an OLED display substrate provided by the present disclosure. This embodiment is a modification of the embodiment shown in FIG. 6. Different from the embodiment shown in FIG. 6, this embodiment only provides the second band gap layer and the first band gap layer is not provided. As shown in FIG. 9, the OLED display substrate of this embodiment includes: a driving substrate 10; a first light emitting unit 21, a second light emitting unit 22, and a third light emitting unit 23 periodically arranged on the driving substrate 10; the first light emitting unit 21, the second light emitting unit 22, and the third light emitting unit 23 being capable of emitting light of the first color under the driving of the driving substrate 10; a protective layer 80 provided on the first light emitting unit 21, the second light emitting unit 22, and the third light emitting unit 23; a second color conversion unit 42 and a third color conversion unit 43 provided on the protective layer 80, the second color conversion unit 42 corresponding to the position of the second light emitting unit 22 and being configured to convert the light of the first color emitted from the second light emitting unit 22 into the light of the second color; the third color conversion unit 43 corresponding to the position of the third light emitting unit 23 and being configured to convert the light of the first color emitted from the third light emitting unit 23 into the light of the third color; a planarization layer 50 covering the protective layer 80, the second color conversion unit 42 and the third color conversion unit 43; a second band gap layer disposed on the planarization layer 50, the second band gap layer including at least a second band gap unit 72 and a third band gap unit 73; the second band gap unit 72 corresponding to the position of the second color conversion unit 42, the second band gap unit 72 being configured to transmit the light of the second color in the light exit direction and reflect the light of the first color in the direction opposite to the light exit direction; the third band gap unit 73 corresponding to the position of the third color conversion unit 43, the third band gap unit 73 being configured to transmit the light of the third color in the light exit direction and reflect the light of the first color in the direction opposite to the light exit direction.

Similar to the embodiment shown in FIG. 6, in this embodiment, each of the second band gap unit 72 and the third band gap unit 73 may be a photonic band gap PBG layer/electromagnetic band gap EBG layer, or a stacked structure layer. The second band gap unit 72 has a transmittance of ≥80% for light of the second color and a reflectivity of ≥85% for light of the first color. Optionally, the second band gap unit 72 has a transmittance of ≥90% for light of the second color. Optionally, the second band gap unit 72 has a reflectivity of ≥95% for the light of the first color. The third band gap unit 73 has a transmittance of ≥80% for the light of the third color and a reflectivity of ≥85% for the light of the first color. Optionally, the third band gap unit 73 has a transmittance of ≥90% for the light of the third color. Optionally, the third band gap unit 73 has a reflectivity of ≥95% for the light of the first color.

Although the first band gap layer is not provided in this embodiment, the second color conversion unit 42 and the third color conversion unit having band gap characteristics are provided in this embodiment. When the unconverted light of the first color from the second color conversion unit 42 and the third color conversion unit 43 is incident on the second band gap unit 72 and the third band gap unit 73, since the second band gap unit 72 and the third band gap unit 73 have the high reflectivity for the light of the first color, this part of the light of the first color is reflected back to the second color conversion unit 42 and the third color conversion unit 43 by the second band gap unit 72 and the third band gap unit 73, and is converted again. In this way, the second band gap unit 72 and the third band gap unit 73 reflect the light of the first color, and the unconverted light of the first color can be continuously converted until all conversions are completed, which also improves the conversion efficiency and reduces the light of the first color in the light of the second color and the light of the third color, improving the light output and light output efficiency of the light of the second color and the light of the third color, and improving the color purity of the light of the second color and the light of the third color.

Table 3 shows the comparison test results of the output light brightness of the embodiment of the present disclosure and the comparative example. In Table 3, the meanings of R, G, B, Brightness, CIEx, CIEy, and DCI-P3 color gamut are the same as those in Table 1 above. Item 1 is a comparative example, using a quantum dot conversion layer QDs and a color filter layer CF. Item 4 is the present embodiment, which uses the quantum dot conversion layer QDs and the second band gap layer PBG2. As shown in Table 3, under the condition that the amount of blue light emitted from the three light emitting units is constant, the brightness of the three colors of the comparative example is set to 100%. The brightness of the output red light R of the present embodiment is 132%, the brightness of the output green light G of the present embodiment is 157%, the brightness of the output blue light B of the present embodiment is 220%, which are all greater than those of the comparative example. Meanwhile, the CIE color space coordinates and DCI-P3 color gamut of the red, green and blue light of the present embodiment are similar to the comparative example. The comparison test result shows that, compared with the existing structure provided with the color filter layer, this embodiment effectively improves the light output and the light output efficiency of red light and green light. In addition, as can be seen from the comparison between Table 2 and Table 3, although the brightness of the output red and green light of this embodiment is lower than the solution of the embodiment shown in FIG. 6, this embodiment has the advantages of simple structure and less preparation process, it can thus be used when the brightness requirements are met.

TABLE 3 the brightness of output light of the embodiment of the present disclosure and comparative example

| Item | Structural features | R | | | G | | | B | | | DCI-P3 color gamut |
|---|---|---|---|---|---|---|---|---|---|---|---|
| | | Brightness | CIEx | CIEy | Brightness | CIEx | CIEy | Brightness | CIEx | CIEy | |
| 1 | QDs + CF | 100% | 0.706 | 0.293 | 100% | 0.203 | 0.757 | 100% | 0.145 | 0.035 | 100% |
| 4 | QDs + PBG2 | 132% | 0.681 | 0.301 | 157% | 0.223 | 0.667 | 220% | 0.144 | 0.047 | 90% |

The foregoing embodiments have been described by taking the example that the first band gap layer, the color conversion unit, the color filter layer/the second band gap layer are all provided on the driving substrate. Based on the technical solutions of the foregoing embodiments, the OLED display substrate may further include a cover plate. The light emitting units may be provided on the driving substrate to form a light emitting substrate. The first band gap layer, the color conversion unit, the color filter layer/the second band gap layer may be provided on the cover plate to form a light processing substrate. Then, an alignment process may be performed on the light emitting substrate and the light processing substrate to form an OLED display substrate. When the band gap layer and the color conversion unit are arranged on the cover plate, the influence of the process of preparing the band gap layer and the color conversion unit on the light emitting unit layer does not need to be considered, and there is a wide space for selecting materials and process parameters.

Based on the technical concept of the foregoing embodiments, an embodiment of the present disclosure also provides a method for manufacturing an OLED display substrate. The method for manufacturing the OLED display substrate includes: S1, forming a light emitting unit layer that emits light of a first color; and S2, forming a band gap layer and a color conversion layer, the color conversion layer being configured to convert a part of the light of the first color into light of a second color and light of a third color, respectively; the band gap layer being configured to transmit the light of the second color and the light of the third color in a light exit direction of the OLED display substrate.

In one embodiment, step S1 includes: forming a first light emitting unit, a second light emitting unit, and a third light emitting unit on a driving substrate, which are periodically arranged and emit light of the first color. Step S2 includes: forming a first band gap layer on the light emitting unit layer, the first band gap layer being configured to transmit the light of the first color in the light exit direction and reflect the light of the second color and the light of the third color; forming a color conversion layer including a second color conversion unit and a third color conversion unit on the first band gap layer, the second color conversion unit corresponding to the position of the second light emitting unit and being configured to convert the light of the first color into light of the second color, the third color conversion unit corresponding to the position of the third light emitting unit and being configured to convert the light of the first color into light of the third color.

The method may further include: forming a planarization layer covering the color conversion layer; and forming a color filter layer including a second filter unit and a third filter unit on the planarization layer. The second filter unit corresponds to the position of the second color conversion unit, and is configured to transmit the light of the second color in the light exit direction and absorb the light of the first color. The third filter unit corresponds to the position of the third color conversion unit, and is configured to transmit the light of the third color in the light exit direction and absorb the light of the first color.

The method may further include: forming a planarization layer covering the color conversion layer; and forming a second band gap layer including a second band gap unit and a third band gap unit on the planarization layer. The second band gap unit corresponds to the position of the second color conversion unit, and is configured to transmit the light of the second color in the light exit direction and reflect the light of the first color in a direction opposite to the light exit direction. The third band gap unit corresponds to the position of the third color conversion unit, and is configured to transmit the light of the third color in the light exit direction and reflect the light of the first color in the direction opposite to the light exit direction.

In another embodiment, step S1 includes: forming a first light emitting unit, a second light emitting unit, and a third light emitting unit on the driving substrate, which are periodically arranged and emit light of a first color. Step S2 includes: forming a protective layer covering the light emitting unit layer; forming a color conversion layer including a second color conversion unit and a third color conversion unit on the protective layer. The second color conversion unit corresponds to the position of the second light emitting unit, and is configured to convert the light of the first color into light of a second color. The third color conversion unit corresponds to the position of the third light emitting unit, and is configured to convert the light of the first color into light of a third color. A planarization layer covering the color conversion layer is formed. A second band gap layer including a second band gap unit and a third band gap unit is formed on the planarization layer. The second band gap unit corresponds to the position of the second color conversion unit, and is configured to transmit the light of the second color in the light exit direction and reflect the light of the first color in a direction opposite to the light exit direction. The third band gap unit corresponds to the position of the third color conversion unit, and is configured to transmit the light of the third color in the light exit direction and reflect the light of the first color in the direction opposite to the light exit direction.

In yet another embodiment, step S1 includes: forming a first light emitting unit, a second light emitting unit, and a third light emitting unit on a driving substrate to form a light emitting substrate. The first light emitting unit, the second light emitting unit, and the third light emitting unit are periodically arranged and emit light of the first color. Step S2 includes: forming a band gap layer and a color conversion layer on a cover plate to form a light processing substrate.

The method may further include: performing an alignment process on the light emitting substrate and the light processing substrate.

The first band gap layer 30 has a transmittance of ≥80% for light of the first color, and a reflectivity of ≥85% for light of the second color and light of the third color. Optionally, the first band gap layer 30 has a transmittance of ≥90% for the light of the first color. Optionally, the first band gap layer 30 has a reflectivity of ≥95% for the light of the second color and the light of the third color. The second band gap unit 72 has a transmittance of ≥80% for light of the second color and a reflectivity of ≥85% for the light of the first color. Optionally, the second band gap unit 72 has a transmittance of ≥90% for the light of the second color. Optionally, the second band gap unit 72 has a reflectivity of ≥95% for the light of the first color. The third band gap unit 73 has a transmittance of ≥80% for the light of the third color and a reflectivity of ≥85% for the light of the first color. Optionally, the third band gap unit 73 has a transmittance of ≥90% for the light of the third color. Optionally, the third band gap unit 73 has a reflectivity of ≥95% for the light of the first color.

The first band gap layer and the second band gap layer are photonic band gap layers or stacked structure layers. The thickness of the photonic band gap layer is 0.5 μm to 2.0 μm, and the thickness of the stacked structure layer is 0.5 μm to 10.0 μm. The stacked structure layer includes 3 to 5 dielectric layers stacked in sequence, and adjacent dielectric layers have different refractive indexes.

The light of the first color is blue light, and the color conversion layer is a quantum dot conversion layer.

The structures, materials, and related parameters of the light emitting unit layer, the color conversion layer, the first band gap layer, and the second band gap layer have been described in detail in the foregoing embodiments, and will not be repeated here.

When forming the light emitting unit layer, an organic light emitting layer covering the entire driving substrate may be formed on the driving substrate by using an evaporation process without using FMM. When forming the second color conversion unit or the third color conversion unit, a photoresist doped with quantum dots of the second color or the third color may be used by spin coating, and then a photolithography process may be performed; it is also possible to use glue doped with quantum dots of the second color and glue doped with quantum dots of the third color to perform inkjet printing respectively, or to use the imprint method. When forming the second filter unit and the third filter unit, vapor deposition, inkjet printing, or photolithography may be used. When forming the first band gap layer and the second band gap layer, one or more methods of dielectric rod stacking, precision mechanical drilling, colloidal particle self-organization growth, colloidal solution self-organization growth, and semiconductor process can be used. The above process methods are all mature processes in the art and are well known to those skilled in the art, and will not be repeated here.

Based on the technical concept of the foregoing embodiments, an embodiment of the present disclosure also provides an OLED display device including the OLED display substrate provided in any of the foregoing embodiments. The OLED display device may be any product or component with a display function such as a display panel, a mobile phone, a tablet computer, a television, a notebook computer, a digital photo frame, a navigator, and the like.

Of course, implementing any of the products or methods of the present disclosure does not necessarily need to achieve all the advantages described above at the same time. The objects and advantages of the embodiments of the present disclosure can be realized and obtained by the structures particularly pointed out in the specification, claims, and drawings.

In the description of the embodiments of the present disclosure, it should be understood that the terms "first", "second", and "third" are for descriptive purposes only, and cannot be understood as indicating or implying relative importance or implicitly indicating that the order or number of technical features indicated.

In the description of the embodiments of the present disclosure, it should be understood that the terms "middle", "upper", "lower", "front", "back", "vertical", "horizontal", "top", "bottom", "inner", "outer", etc. indicating the orientation or positional relationship are based on the orientation or positional relationship shown in the drawings, just to facilitate the description of the present disclosure and simplify the description, and does not indicate or imply that the device or element referred to must have a specific orientation, or be constructed and operated in a specific orientation, and therefore cannot be construed as a limitation of the present disclosure.

In the description of the embodiments of the present disclosure, it should be noted that, unless otherwise clearly specified and limited, the terms "installation", "connection", and "connected" should be understood in a broad sense, for example, it can be a fixed connection, a detachable connection, or an integral connection; it can be a mechanical connection or an electrical connection; it can be a direct connection or an indirect connection through an intermediate medium, or it can be an internal connection between two components. For those of ordinary skill in the art, the specific meaning of the above terms in the present disclosure may be understood in specific situations.

Although the embodiments disclosed in the present disclosure are as described above, the described contents are only the embodiments adopted to facilitate understanding of the present disclosure, and are not intended to limit the present disclosure. Any person skilled in the art to which this disclosure belongs can make any modifications and changes in the form and details of implementation without departing from the spirit and scope disclosed in this disclosure. The patent protection scope of this disclosure is defined by the appended claims.

What is claimed is:

1. An organic light emitting diode display substrate, comprising:
    a light emitting unit layer;
    a first band gap layer; and
    a color conversion layer,
    wherein the first band gap layer and the color conversion layer are on a light exit path of the light emitting unit layer,
    wherein the light emitting unit layer comprises a first light emitting unit, a second light emitting unit, and a third light emitting unit periodically arranged on a driving substrate and configured to emit light of a first color,
    wherein the color conversion layer is configured to convert a part of the light of the first color into light of a second color and light of a third color, respectively,
    wherein the first band gap layer is between the light emitting unit layer and the color conversion layer and overlaps the second light emitting unit and the third light emitting unit, and
    wherein the first band gap layer comprises a stacked structure layer, the stacked structure layer comprises a first inorganic layer, a first organic layer, and a second inorganic layer stacked in sequence, and a refractive index of any one of the first inorganic layer, the first organic layer, and the second inorganic layer is in a range of 1.3 to 2.4.

2. The organic light emitting diode display substrate according to claim 1,
wherein the color conversion layer comprises a second color conversion unit on a light exit path of the second light emitting unit and is configured to convert the light of the first color into the light of the second color, and a third color conversion unit on a light exit path of the third light emitting unit and is configured to convert the light of the first color into the light of the third color.

3. The organic light emitting diode display substrate according to claim 2, further comprising:
a color filter layer on a light exit path of the second color conversion unit and the third color conversion unit,
wherein the color filter layer is configured to transmit the light of the second color and the light of the third color in a light exit direction and absorb the light of the first color.

4. The organic light emitting diode display substrate according to claim 3,
wherein the color filter layer comprises a second filter unit and a third filter unit,
wherein the second filter unit corresponds to a position of the second color conversion unit, and is configured to transmit the light of the second color in the light exit direction and absorb the light of the first color, and
wherein the third filter unit corresponds to a position of the third color conversion unit, and is configured to transmit the light of the third color in the light exit direction and absorb the light of the first color.

5. The organic light emitting diode display substrate according to claim 2, wherein the color conversion layer further comprises a first color conversion unit configured to transmit the light of the first color emitted from the first light emitting unit.

6. The organic light emitting diode display substrate according to claim 2, further comprising:
a second band gap layer on a light exit path of the second color conversion unit and the third color conversion unit,
wherein the second band gap layer is configured to transmit the light of the second color and the light of the third color in a light exit direction and reflect the light of the first color in a direction opposite to the light exit direction.

7. The organic light emitting diode display substrate according to claim 6,
wherein the second band gap layer is on a planarization layer on the second color conversion unit and the third color conversion unit, and comprises a second band gap unit and a third band gap unit,
wherein the second band gap unit corresponds to a position of the second color conversion unit, and is configured to transmit the light of the second color in the light exit direction and reflect the light of the first color in the direction opposite to the light exit direction, and
wherein the third band gap unit corresponds to a position of the third color conversion unit, and is configured to transmit the light of the third color in the light exit direction and reflect the light of the first color in the direction opposite to the light exit direction.

8. The organic light emitting diode display substrate according to claim 2,
wherein the first band gap layer is a stacked structure layer,
wherein the stacked structure layer comprises three to five sequentially stacked dielectric layers, and
wherein refractive indexes of adjacent dielectric layers of the sequentially stacked dielectric layers are different from each other.

9. The organic light emitting diode display substrate according to claim 1, wherein the first band gap layer further overlaps the first light emitting unit.

10. The organic light emitting diode display substrate according to claim 1, further comprising:
a protective layer on a side of the first light emitting unit, the second light emitting unit, and the third light emitting unit facing the first band gap layer.

11. The organic light emitting diode display substrate according to claim 1,
wherein the light of the first color comprises blue light, and
wherein the color conversion layer comprises a quantum dot conversion layer.

12. A display device comprising the organic light emitting diode display substrate according to claim 1.

13. An organic light emitting diode display substrate, comprising:
a light emitting unit layer;
a color conversion layer; and
a second band gap layer,
wherein the color conversion layer and the second band gap layer are on a light exit path of the light emitting unit layer,
wherein the light emitting unit layer comprises a first light emitting unit, a second light emitting unit, and a third light emitting unit periodically arranged on a driving substrate and configured to emit light of a first color,
wherein the color conversion layer is configured to convert a part of the light of the first color into light of a second color and light of a third color, respectively,
wherein the second band gap layer is on a side of the color conversion layer away from the light emitting unit layer, and
wherein the second band gap layer comprises a stacked structure layer, the stacked structure layer comprises a first inorganic layer, a first organic layer, and a second inorganic layer stacked in sequence, and a refractive index of any one of the first inorganic layer, the first organic layer, and the second inorganic layer is in a range of 1.3 to 2.4.

14. The organic light emitting diode display substrate according to claim 13,
wherein the color conversion layer comprises a second color conversion unit on a light exit path of the second light emitting unit and is configured to convert the light of the first color into the light of the second color, and
wherein a third color conversion unit on a light exit path of the third light emitting unit is configured to convert the light of the first color into the light of the third color.

15. The organic light emitting diode display substrate according to claim 14, wherein the second band gap layer is on a planarization layer on the second color conversion unit and the third color conversion unit, and comprises a second band gap unit and a third band gap unit,
wherein the second band gap unit corresponds to a position of the second color conversion unit, and is configured to transmit the light of the second color in a light exit direction and reflect the light of the first color in a direction opposite to the light exit direction, wherein the third band gap unit corresponds to a position of the third color conversion unit, and is configured to transmit the light of the third color in the light exit direction and reflect the light of the first color in the direction opposite to the light exit direction, wherein the second band gap unit has a transmittance of ≥80% for the light of the second color and a reflectivity of ≥85% for the light of the first color, and wherein the third band gap unit has a transmittance of ≥80% for the light of the third color and a reflectivity of ≥85% for the light of the first color.

16. The organic light emitting diode display substrate according to claim 13,
wherein the second band gap layer is one of a photonic band gap layer or a stacked structure layer,
wherein a thickness of the photonic band gap layer is 0.5 µm to 2.0 µm,
wherein a thickness of the stacked structure layer is 0.5 µm to 10.0 µm,
wherein the stacked structure layer comprises three to five sequentially stacked dielectric layers, and
wherein refractive indexes of adjacent dielectric layers of the sequentially stacked dielectric layers are different from each other.

17. The organic light emitting diode display substrate according to claim 13,
wherein the light of the first color comprises blue light, and
wherein the color conversion layer comprises a quantum dot conversion layer.

18. A method for manufacturing the organic light emitting diode display substrate according to claim 13, comprising:
forming the light emitting unit layer that is configured to emit light of the first color; and
forming the color conversion layer and the second band gap layer.

19. A method for manufacturing an organic light emitting diode display substrate, comprising:
forming a light emitting unit layer that is configured to emit light of a first color, the light emitting unit layer comprising a first light emitting unit, a second light emitting unit, and a third light emitting unit periodically arranged on a driving substrate; and
forming a first band gap layer and a color conversion layer,
wherein the first band gap layer is between the light emitting unit layer and the color conversion layer and overlaps the second light emitting unit and the third light emitting unit,
wherein the color conversion layer is configured to convert a part of the light of the first color into light of a second color and light of a third color, respectively, and
wherein the first band gap layer comprises a stacked structure layer forming a two-dimensional photonic crystal structure, the stacked structure layer comprises a first inorganic layer, a first organic layer, and a second inorganic layer stacked in sequence, and a refractive index of any one of the first inorganic layer, the first organic layer, and the second inorganic layer is in a range of 1.3 to 2.4.

20. The method according to claim 19, further comprising:
forming a second band gap layer,
wherein the second band gap layer is on a side of the color conversion layer away from the light emitting unit layer, and
wherein the second band gap layer is configured to transmit the light of the second color and the light of the third color in a light exit direction and reflect the light of the first color in a direction opposite to the light exit direction.

\* \* \* \* \*